United States Patent
Ellis

(10) Patent No.: US 7,365,287 B1
(45) Date of Patent: Apr. 29, 2008

(54) VERTICAL ELECTRICALLY HEATED OVEN FOR BAKING COATED PARTS

(76) Inventor: Frederick G. Ellis, 80 Burnett Avenue, Winnipeg, Manitoba (CA) R2G 1C1

( * ) Notice: Subject to any disclaimer, the term of this patent is extended or adjusted under 35 U.S.C. 154(b) by 0 days.

(21) Appl. No.: 11/564,454

(22) Filed: Nov. 29, 2006

(51) Int. Cl.
*F27B 1/09* (2006.01)
*F27B 9/10* (2006.01)
*F27B 9/24* (2006.01)

(52) U.S. Cl. ............. 219/388; 219/400; 432/121; 432/148

(58) Field of Classification Search ............. None
See application file for complete search history.

(56) References Cited

U.S. PATENT DOCUMENTS

| | | | |
|---|---|---|---|
| 4,009,301 A | | 2/1977 | Heckman et al. |
| 4,077,528 A | * | 3/1978 | Santen ............ 34/189 |
| 5,000,985 A | | 3/1991 | Salisbury |
| 5,030,809 A | * | 7/1991 | Buday ............ 219/388 |
| 6,164,961 A | * | 12/2000 | Luscher et al. ..... 432/121 |
| 6,194,688 B1 | | 2/2001 | Ellis |
| 6,294,763 B1 | * | 9/2001 | Aono et al. ......... 219/400 |

FOREIGN PATENT DOCUMENTS

JP     11285660 A   * 10/1999

\* cited by examiner

*Primary Examiner*—Joseph M. Pelham
(74) *Attorney, Agent, or Firm*—Adrian D. Battison; Michael R. Williams; Ryan W. Dupuis

(57) ABSTRACT

An oven for baking a batch of parts has a housing having side walls and a top wall defining a closed container with a closed top end and an open downwardly facing bottom end. Loading/unloading occurs at the bottom end onto a carriage raised to the top end where baking occurs. On each side is provided an array of heating elements below the top. A shield is located in front of the heating array so as to block direct radiation onto the parts to prevent over-heating as the carrying arrangement passes the heating array to be unloaded. The shield generates an upwardly flowing air stream to carry the heat to the top. The heating elements are mounted with their lower end in a connection box with a collar and insulated heat shield above the box to keep the electrical connections cooled.

27 Claims, 5 Drawing Sheets

VERTICAL ELECTRICALLY HEATED OVEN FOR BAKING COATED PARTS

The present invention relates to a vertical electrically heated oven for baking coated parts.

BACKGROUND OF THE INVENTION

Various products require a coating applied thereto to be baked to cure the coating so that it is fixed to the part. One example is that of circuit boards where a coating is applied and then baked. Another example relates to the powder coating of metal parts which is a relatively recent method for protecting and beautifying products. Powder coating makes a product highly chip and scratch resistant and highly chemical, petroleum and salt resistant. Powder coating has the ability to apply a thick, even coat without drips or sags and has premium insulating qualities, both electrical and thermal and also removes the cold feeling from metals. It gives a decorative finish to a product along with a protective finish which is resistant to fading. Powder coating has the ability to encapsulate products, wrap around corners, help eliminate sharp edges achieve with one high quality coat with no primer necessary and can resist abuse in low and high temperature variances. Powder coating has virtually unlimited number of colours and a wide variety of finishes.

Generally powder coating is applied to many metal products powder coatings are 100% solids coatings applied as a dry powder mix of resin and pigment and subsequently formed into a film with heat. The solid resin binder melts upon heating, binds the pigment, and results in a pigment coating upon cooling. The powder is applied either by an electrostatic spray or by passing the part over a fluidised bed of powder. In both cases the parts undergo subsequent oven heating to provide a smooth continuous film.

Powder coated materials have to be heated in an oven or the like, an example of a powder coat oven is shown in U.S. Pat. No. 5,155,335 issued October 1982 of Habaki et al wherein the oven has an inlet air shield chamber connected to a horizontal heating chamber. The oven of Habaki has a generally horizontal conveyor which is limited to one item at a time in the oven on the conveyor which is adequate for large items which need to be relatively spaced out but is not very effective for small items such as jewelry and the like.

U.S. Pat. No. 4,009,301 issued February 1977 of Heckman et al discloses a method for powder coating materials. A large apparatus is used to carry items on a conveyor through a series of steps wherein the item is powder coated and baked.

U.S. Pat. No. 5,000,985 issued March 1991 of Salisbury shows a similar method of powder coating wherein materials are carried on a conveyor through the processes.

The above patents are not effective for small objects and are relatively inefficient. It will be appreciated that the parts which are relatively small are generally suspended on the carriage from a hook or the like so that each is separate as it passes through the oven.

In U.S. Pat. No. 6,194,688 issued Feb. 27, 2001 of the present inventor is shown a novel construction of oven which comprises a housing having side walls defining a closed top end and an open bottom end, with a pair of opposed heating elements in the housing at the side walls. A carrying arrangement in the housing carries a batch of parts from the bottom end where the parts are loaded on to the carrying arrangement to the top end where the parts are baked by the heat rising from the heating element. The carrying arrangement is mounted on a guide which has a track located on respective side walls in the housings a pair of wheel arrangements on the carrying arrangement engage each track and a cable is supported by a series of pulleys and is connected to a cable winch which is controlled by the control station for driving the carrying arrangement in the housing. The carrying arrangement has a removable rack comprising a series of hooks in which the parts are attached. The bottom end has an opening such that the carrying arrangement is accessible. The housing has insulated oven panels. The control station has an up control, a pause control, a down control, a temperature control meter and an upper holding time control. In this patent is disclosed an air blower for circulating the heated air in the oven mixing the air and making the temperature of the heat uniform.

This oven shows significant improvements in energy efficiency and convenience of operation. However some structural improvements are required for effective operation.

SUMMARY OF THE INVENTION

It is one object of the present invention to provide a baking oven.

According to one aspect of the invention there is provided an apparatus for baking one or more parts in a batch comprising:

a housing having side walls and a top wall defining a substantially closed container with a substantially closed top end and an opening at a bottom end;

at least one heating assembly within the housing at a position therein below the top end for generating heat in the housing such that heat rises in the housing from the heating assembly and causes the top end above the heating assembly to reach an oven temperature for baking the parts;

a carrying arrangement in the housing for carrying the batch of parts;

a lifting and guide arrangement for guiding movement of the carrying arrangement upwardly in an upward path from a first position at the bottom end of the housing to a second position at the top end and in a downward path back to the first position;

the housing, the lifting and guide arrangement and the carrying arrangement being arranged such that, in the first position, the carrying arrangement is exposed at the bottom end for loading the batch for baking and for unloading of the batch when baked;

and a control system for controlling said at least one heating assembly and the lifting and guide arrangement such that, in the second position, the carrying arrangement is held stationary for a period of time for baking of the batch;

said at least one heating assembly comprising a generally planar heating array arranged along one side wall inwardly of the side wall and such that the carrying arrangement passes said at least one heating assembly as it moves from the first position to the second position;

a shield arrangement located in front of the heating array relative to the carrying arrangement so as to block at least part of the heat from the heating array from directly radiating onto the batch of parts on the carrying arrangement as the carrying arrangement passes the heating array.

Preferably the shield arrangement is shaped and arranged relative to the side wall so as to define an inlet opening below the shield arrangement for entry of air behind the shield and an outlet opening above the shield for exit of air from behind the shield such that the heat from said at least one heating assembly generates a flow of air upwardly behind the shield to carry the heat in the airflow to the top of the housing.

Preferably the shield arrangement is shaped and arranged to block sufficient of the heating array to prevent overheating of the batch as the carrying arrangement is lowered to the first position.

There may be only a single heating array but preferably there are two heating assemblies each comprising a generally planar heating array arranged along a respective side wall inwardly of the side wall with the heating arrays opposed to face one another and such that the carrying arrangement passes between said heating assemblies as it moves from the first position to the second position.

In this case there are two shields each located in front of a respective the heating array relative to the carrying arrangement so as to block at least part of the heat from the heating array from directly radiating onto the batch of parts on the carrying arrangement as the carrying arrangement passes the heating array.

Preferably the heating assembly comprises an array of side by side heating elements.

In one arrangement the shield arrangement comprises a single shield plate covering the whole heating assembly. However it will be appreciated that the shield may be formed as a number of shield portions in an array.

Preferably the shield is planar and generally parallel to the heating assembly.

Preferably the heating array comprises a plurality of upstanding heating elements each having a bottom electrical connection, an upstanding connection portion and an upper heating section.

In another arrangement, the shield arrangement comprises a series of separate shield portions each associated with a respective one of the heating elements.

In this case the shield portions can be in front of the heating elements or more preferably defined by a series of tubes each surrounding a respective one of the heating elements.

Preferably the shield is shaped and arranged to block substantially all of the heating sections of the heating elements.

The objective of the shield is to preferably block sufficient of the heating sections of the heating elements to prevent overheating of the batch as the carrying arrangement is lowered to the first position.

Where the heating array comprises a plurality of upstanding heating elements each having a bottom electrical connection, an upstanding connection portion and an upper heating section, preferably there is provided an electrical connection box having an upper wall with the electrical connection of each of the elements mounted in the upper wall and the connection portion and the heating section stand upwardly from the upper wall and electrical connector wires of the elements are located in the box, and there is provided an insulated heat shield plate above the upper wall and generally parallel thereto with each of the elements projecting through a respective hole in the heat shield plate so that the upper heating section is above the heat shield plate.

In this arrangement preferably there is provided a collar surrounding the connection portion between the upper wall and the heat shield plate, the collar having openings therein to allow entry of air into the collar and escape of air from a top of the collar through the heat shield plate.

Preferably the top of the collar is coextensive with the respective hole in the heat shield plate.

The housing may be fully closed at the top but more preferably there is provided a ventilation outlet at the top of the housing to extract a low air flow to extract fumes with the outlet being located in the top wall or more preferably in a side wall adjacent the top.

Preferably the housing has reflective inner walls to reflect infrared rays emitted by the heating assembly.

According to a second aspect of the invention there is provided an apparatus for baking a batch of parts comprising:

a housing having side walls and a top wall defining a substantially closed container with a substantially closed top end and an open downwardly facing bottom end;

at least one heating assembly within the housing at a position therein below the top end for generating heat in the housing such that heat rises in the housing from the heating assembly and causes the top end above the heating assembly to reach an oven temperature for baking the parts;

a carrying arrangement in the housing for carrying the batch of parts;

a lifting and guide arrangement for guiding movement of the carrying arrangement upwardly in an upward path from a first position at the bottom end of the housing to a second position at the top end and in a downward path back to the first position;

the housing, the lifting and guide arrangement and the carrying arrangement being arranged such that, in the first position, the carrying arrangement is exposed at the bottom end for loading the batch of parts for baking and for unloading of the batch of parts when baked;

and a control system for controlling said at least one heating assembly and the lifting and guide arrangement such that, in the second position, the carrying arrangement is held stationary for a period of time for baking of the parts;

said at least one heating assembly comprising a generally planar heating array arranged along one side wall inwardly of the side wall and such that the carrying arrangement passes said at least one heating assembly as it moves from the first position to the second position;

wherein the heating array comprises a plurality of upstanding heating elements each having a bottom electrical connection, an upstanding connection portion and an upper heating section;

wherein there is provided an electrical connection box having an upper wall with the electrical connection of each of the elements mounted in the upper wall such that the connection portion and the heating section stand upwardly from the upper wall and electrical connector wires of the elements are located in the box;

and wherein there is provided an insulated heat shield plate above the upper wall and generally parallel thereto with each of the elements projecting through a respective hole in the heat shield plate so that the upper heating section is above the heat shield plate.

According to a third aspect of the invention there is provided an apparatus for baking one or more parts in a batch comprising:

a housing having side walls and a top wall defining a substantially closed container with a substantially closed top end and an opening at a bottom end;

at least one heating assembly within the housing at a position therein below the top end for generating heat in the housing such that heat rises in the housing from the heating assembly and causes the top end above the heating assembly to reach an oven temperature for baking the parts;

a carrying arrangement in the housing for carrying the batch of parts;

a lifting and guide arrangement for guiding movement of the carrying arrangement upwardly in an upward path from a first position at the bottom end of the housing to a second position at the top end and in a downward path back to the first position;

the housing, the lifting and guide arrangement and the carrying arrangement being arranged such that, in the first position, the carrying arrangement is exposed at the bottom end for loading the batch for baking and for unloading of the batch when baked;

and a control system for controlling said at least one heating assembly and the lifting and guide arrangement such that, in the second position, the carrying arrangement is held stationary for a period of time for baking of the batch;

said at least one heating assembly arranged along one side wall inwardly of the side wall and such that the carrying arrangement passes said at least one heating assembly as it moves from the first position to the second position;

wherein the heating assembly is located in at least one duct within the housing with an inlet opening at a bottom of the heating assembly and a discharge opening at a top of the heating array so as to generate a flow of air upwardly within said at least one duct to carry the heat in the airflow to the top of the housing.

In this arrangement, the heating assembly preferably comprises a plurality of side by side elements and each of the elements is located in a respective one of a plurality of separate ducts.

Alternatively the single duct or plurality of ducts includes or is partly defined by a single shield plate located in front of all of the heating elements or a series of separate shield plates each covering one or more of the heating elements.

According to a fourth aspect of the invention there is provided an apparatus for baking one or more parts in a batch comprising:

a housing having side walls and a top wall defining a substantially closed container with a substantially closed top end and an opening at a bottom end;

at least one heating assembly within the housing at a position therein below the top end for generating heat in the housing such that heat rises in the housing from the heating assembly and causes the top end above the heating assembly to reach an oven temperature for baking the parts;

a carrying arrangement in the housing for carrying the batch of parts;

a lifting and guide arrangement for guiding movement of the carrying arrangement upwardly in an upward path from a first position at the bottom end of the housing to a second position at the top end and in a downward path back to the first position;

the housing, the lifting and guide arrangement and the carrying arrangement being arranged such that, in the first position, the carrying arrangement is exposed at the bottom end for loading the batch for baking and for unloading of the batch when baked;

a control system for controlling said at least one heating assembly and the lifting and guide arrangement such that, in the second position, the carrying arrangement is held stationary for a period of time for baking of the batch;

said at least one heating assembly arranged along one side wall inwardly of the side wall and such that the carrying arrangement passes said at least one heating assembly as it moves from the first position to the second position;

the second position at the top end of the housing defining a heating zone located above said at least one heating assembly and located below the top wall;

a first temperature sensor at the bottom of the heating zone above said at least one heating assembly;

and a second temperature sensor at the top of the heating zone;

the control system being arranged to maintain the heating zone within a predetermined range of temperatures by controlling a first part of said at least one heating assembly in response to changes in temperature at said first sensor and by controlling a second part of said at least one heating assembly in response to changes in temperature at said second sensor.

Preferably the at least one heating assembly comprises an array of side by side heating elements and wherein the heating elements are separated into said first and second parts at spaced alternate positions across the heating assembly.

Preferably there is provided a vent opening at a position at the top of the heating zone spaced downwardly from the top wall so as to form a volume of heated air between the heating zone and the top wall.

Preferably the vent opening includes a component for creating a forced flow through the vent opening from the interior of the housing.

BRIEF DESCRIPTION OF THE DRAWINGS

One embodiment of the invention will now be described in conjunction with the accompanying drawings in which.

In the drawings like characters of reference indicate corresponding parts in the different figures.

DETAILED DESCRIPTION

Figure 1:
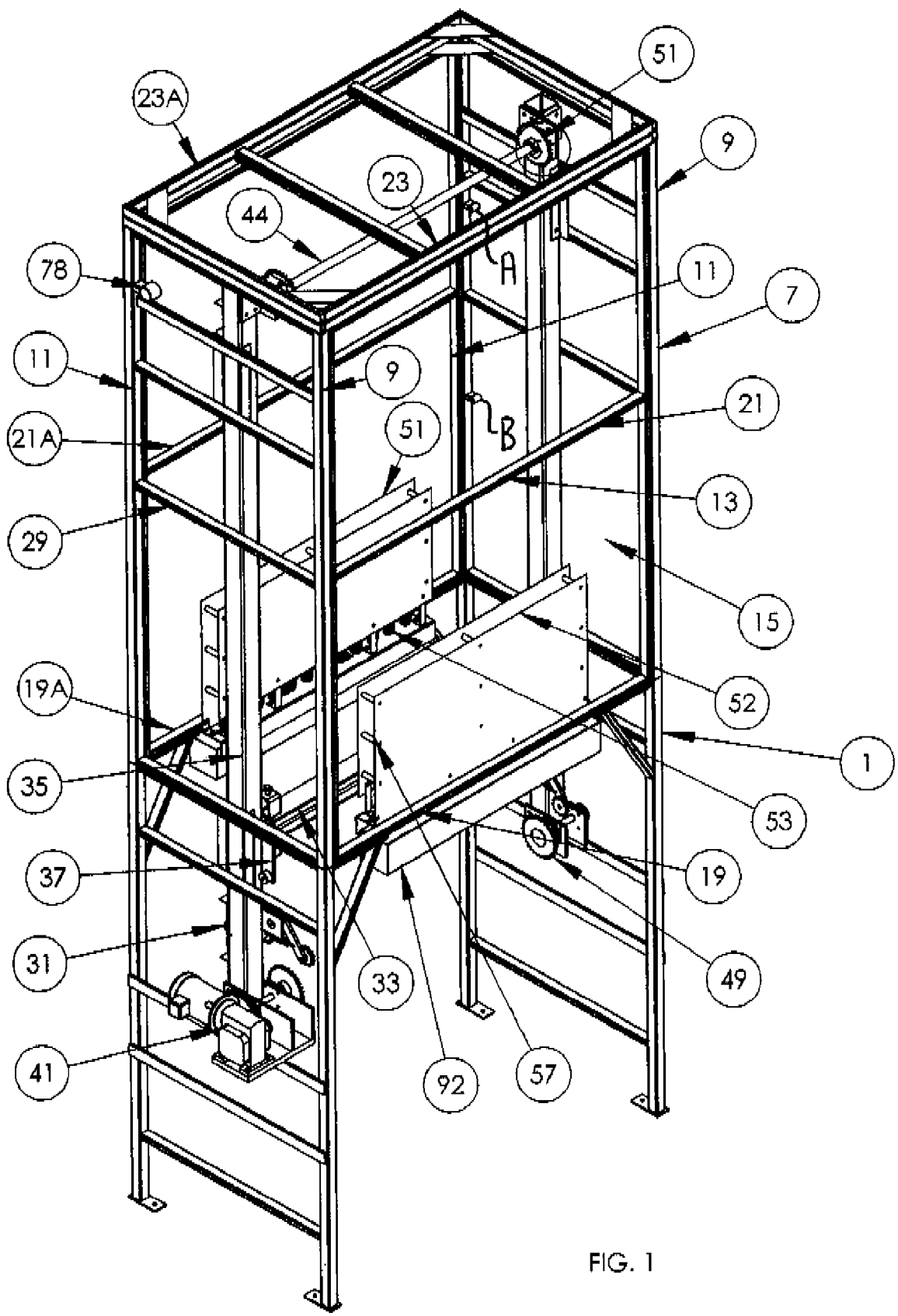
FIG. 1 is an isometric view of one embodiment of the oven according to the present invention with the cover panels removed to show the interior construction.
Figure 2:
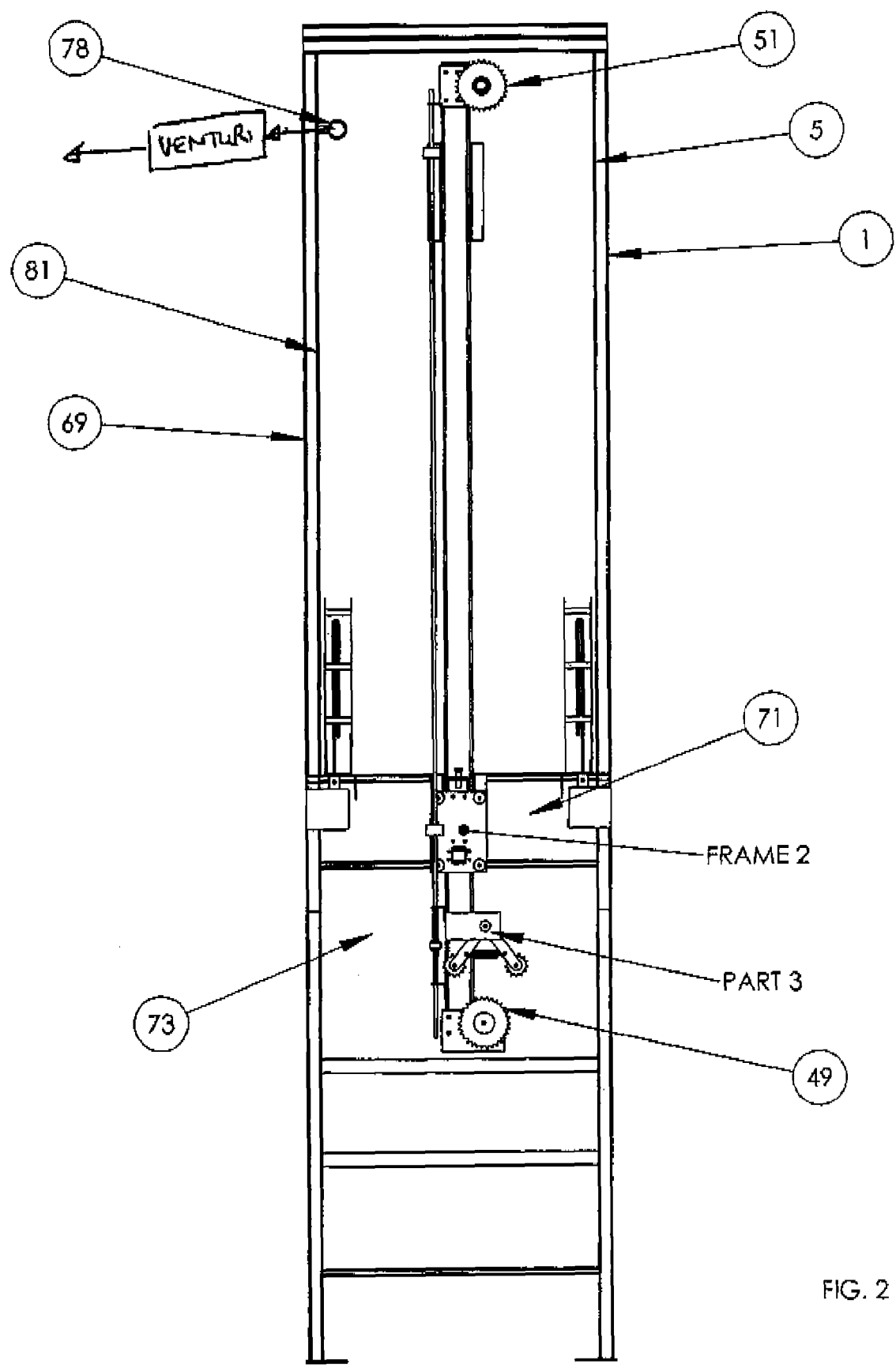
FIG. 2 is a vertical transverse cross sectional view of the oven of FIG. 1.

As shown in FIGS. 1 and 2, a baking oven, generally indicated as 1, is arranged to bake parts 3 carried on a frame 2, which parts have been coated with a suitable coating material such as powder coat.

In some arrangements the frame may carry a large number of smaller parts such as individual castings or the frame may carry a smaller number of larger parts even to the extent of carrying a single part such as a large panel. The dimension of the oven and the frame can be selected in accordance with requirements to receive the number and arrangement of parts in the batch which are necessary or suitable for the process concerned. However in each case the parts or part form a batch which is processed in the oven by loading at the bottom, moving to the baking location and moving back to the loading station for unloading. This is different from a continuous or line process where the parts move along a processing line.

Powder coatings are 100% solids coatings applied as a dry powder mix of resin and pigment and subsequently formed into a film with heat. The solid resin binder melts upon heating, binds the pigment, and results in a pigment coating upon cooling. The powder is applied either by an electrostatic spay or by passing the heated object over a fluidized bed of powder with subsequent oven heating to provide a smooth continuous film.

The oven has a housing 5 and a frame 7 for supporting the housing. In FIG. 1, the panels covering the frame 7 and forming the housing are omitted for convenience of illustration. The frame has two elongate front vertical posts 9 and two elongate rear vertical posts 11 arranged parallel to each other and the two front posts and the two rear posts are spaced equidistantly apart such that the frame is rectangular shaped. The dimensions can vary but in general the frame is higher than it is wide. A plurality of cross beams 13 connect the vertical posts such that the frame has a hollow interior 15. A first set of cross beams connect the front posts wherein a first beam 19 is located generally at the bottom of the posts, a second beam 21 is located approximately at the middle of the posts and a third beam 23 is located at the top end of the posts. A second set of cross beams connect the rear posts wherein a first beam 19A is located generally at the bottom of the posts at the same height and parallel to the first beam 19 of the first set. A second beam 21A located approximately at the middle of the posts at the same height and parallel to the second beam 21 of the first set. A third beam 23A is located at the further most top end of the posts at the same height and parallel to the third beam 23 of the first set. The first set and second set of beams are parallel and of the same length.

A set of side beams 29 connect the front posts to the rear posts which are perpendicular to and at the same height as each of the second set of beams connecting a respective front post to a respective rear post. The side beams are shorter in length than the first and second set of beams.

A carrying arrangement 31 is arranged to carry the parts upwardly and downwardly on a rack 33 in the hollow interior 15 of the frame. The carrying arrangement is mounted on tracks 35 which extend upwardly from the bottom end along each side of the frame on the side beams parallel to the posts. Each of the tracks is arranged to support a respective wheeled carriage 37. The wheels of the carriages 37 engage the track 35 such that the carrying arrangement is movable upwardly and downwardly through the hollow interior along the track. The carrying arrangement is moved by a motor 41 mounted on the frame on a cross beam adjacent to the middle beam which drives a chain at the adjacent track and drives though a cross shaft 44 a corresponding chain at the opposite track. The chains run over top and bottom sprockets 51 and 49 which are located within the housing at the top and bottom respectively of the tracks 35. The carrying arrangement is thus moved directly vertically upwardly and downwardly in the oven, as mentioned above by the two chains which are maintained in synchronism by the cross shaft 44. Thus the carrying arrangement follows the same vertical path in its movement with no side to side or horizontal movement which could cause shaking or jiggling of the parts. Also the cross-shaft 44 ensures that the movement of the two sides is simultaneous to prevent any tilting or binding of the parts or the carrying frame.

A heating arrangement 57 in the oven is arranged to heat the parts when raised by the carrying arrangement, as described in more detail hereinafter. A main control panel (not shown) is provided which has a main breaker and controls the motors up and down drive, pauses the motor and controls the temperature and has a holding timer for holding the parts in the carrying arrangement at the top end of the oven for baking.

Figure 4:
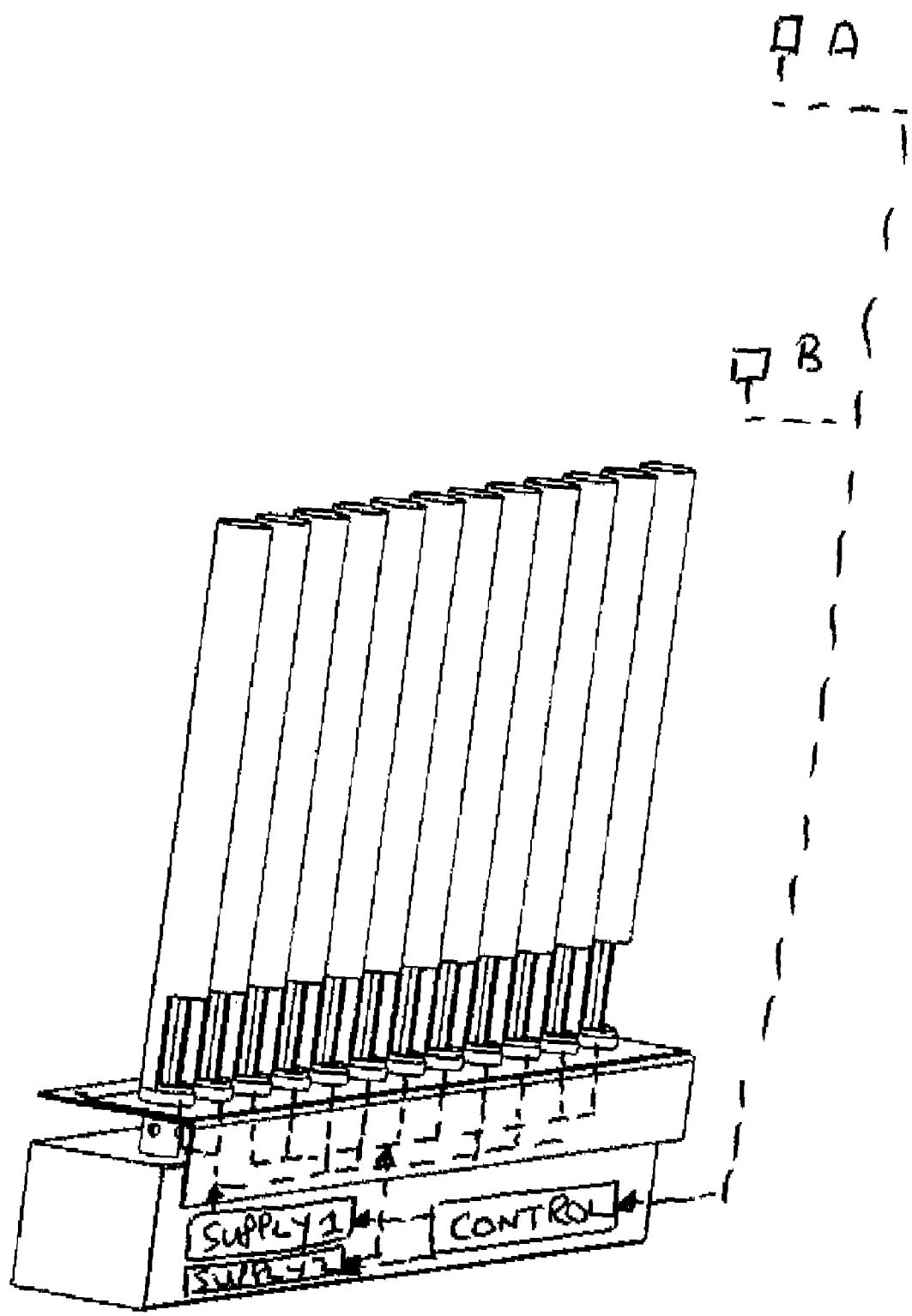
FIG. 4 is an isometric view showing schematically an alternative construction of heating assembly for use in an oven of the type generally shown in FIGS. 1 and 2.

As shown in FIGS. 1 and 4 there are two pyrometer thermocouples A and B located at the top end in the oven for measuring the temperature of the oven so that the oven can be heated at a required predetermined temperature. The temperature sensor A is located at the top of the heating zone where the parts are located during the baking process and this is spaced downwardly from the top wall of the housing. The temperature sensor B is located at the bottom of the heating zone and this is spaced upwardly from the top of the heating assembly.

The housing includes insulated oven panels 69 arranged such that the oven is fully closed at the side walls and top 74 and an opening 71 is located only at the bottom defining a loading and unloading zone 73 below the open bottom 71 of the oven. A ventilation outlet 78 is located at the op in one side wall closely adjacent the top wall. The ventilation outlet is arranged to remove fumes from inside the oven and carry the air through a pipe so that the air is released outside the building.

Inner walls 81 in the oven are made of reflective material, such as stainless steel or galvanized zinc, so that the infrared rays from the heating elements are reflected onto the parts for baking.

In operation, after powder coating, the parts are placed onto the rack which is then placed onto the carrying arrangement. The control panel is activated such that the carrying arrangement is raised vertically into the oven. The carrying arrangement is held in the oven at the top above the heating elements for a predetermined amount of time so that the parts are baked and the carrying arrangement is lowered so that the rack can be removed and a second set of parts on a second rack can be placed onto the carrying arrangement for baking. When the rack reaches the closed top of the oven, the baking is carried out for a set baking period as set by the control system.

The vertical orientation of the oven creates an efficient unit with low energy costs and requires a very small floor space in a building. The oven allows easy loading and unloading of the rack of parts and the parts are maintained stationary on their hanging rack during movement by the direct vertical movement along the path of the tracks.

The heating assembly 57 comprises two separate heating members 51 and 52. These are symmetrical and arranged at opposite side walls so as to face one another across the width of the oven. The heating members 51 and 52 are arranged on the opposite side walls from the tracks so that the frame 33 carried on the tracks passes between the two heating members on its way to the top of the oven at a position spaced above the two heating members. Thus the heating action at the top of the oven is generated by air rising from the heating members rather than by direct irradiation of the parts within the oven at the top of the oven.

Figure 3:
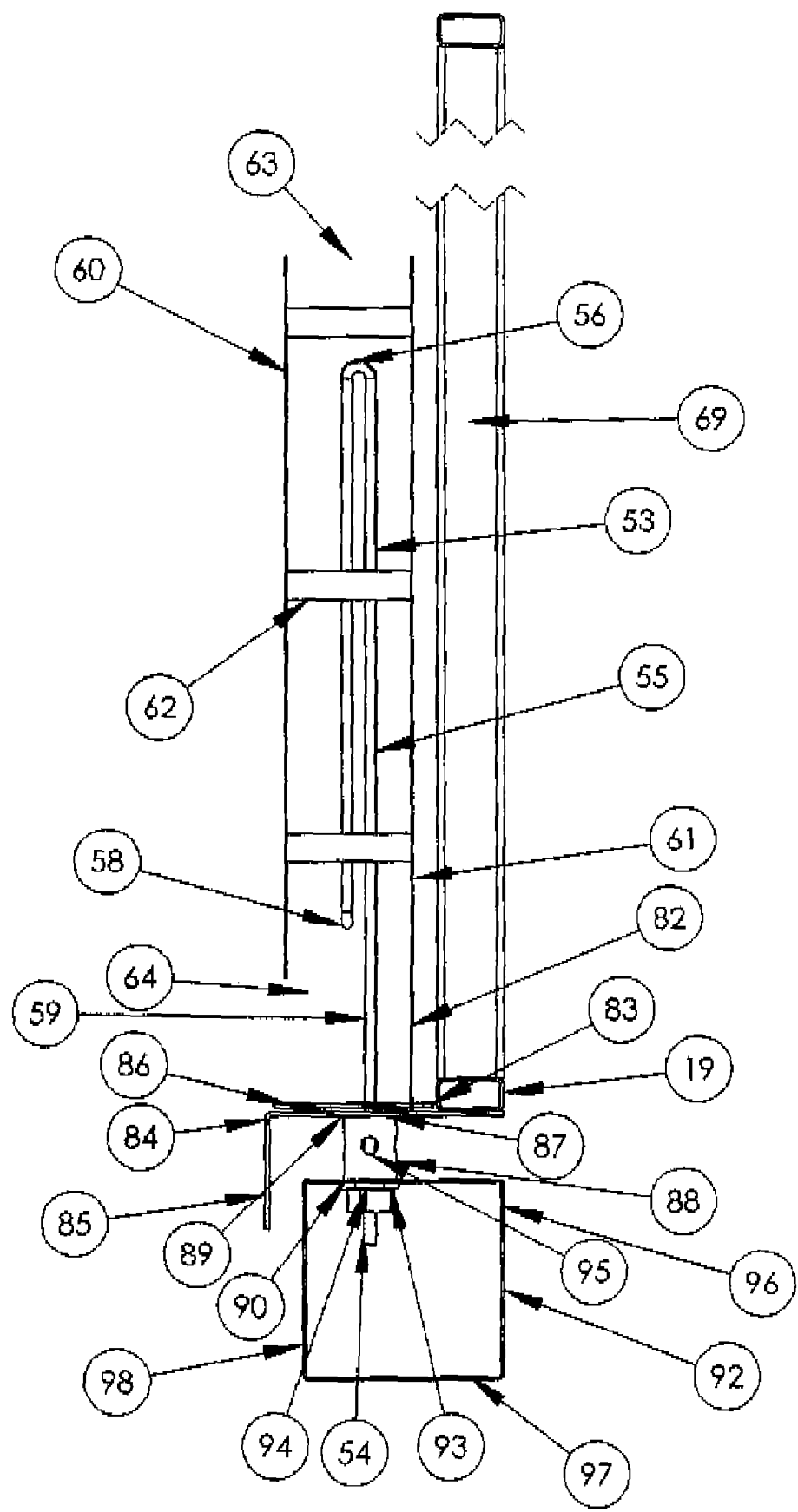
FIG. 3 is a cross sectional view of one heating assembly of the oven of FIGS. 1 and 2.

One of the heating members is shown in cross section in FIG. 3 and it will be appreciated that the other of the heating members is symmetrical and opposite to this and faces the heating member shown across the housing.

Thus the housing comprises a housing wall 69 as previously described which is supported on the frame members including the bottom frame member 19 which is shown. The wall panels are formed of an insulated material of a nature which can be selected by a person skilled in the art.

The heating member shown in FIG. 3 and also visible in FIG. 1 includes an array of heating elements 53 at spaced positions across the width of the heating member. Each heating element 53 includes a bottom mounting bracket 54 to which is attached a tubular container 55 standing upwardly from the bracket with a tubular container having an upper loop section 56 at which it turns downwardly to form a downwardly projecting portion 57 terminating at a lower end 58. Between the lower end 58 and the bracket 54 is a zone 59 of the heating element which is unheated. Thus the heating effect generated by the resistance heating member within the tube is concentrated in the area above the lower end 58 in both of the legs of the tube in that area. Heating elements of this type are of course well known and commercially available. In this embodiment the length of the section 59 which is unheated and acts to merely transport the electricity within cables within the heating element to the resistance heating section above the lower end 58. The section 59 is therefore relatively cool and is heated only by conduction and radiation from the heated section.

The heating elements are supported by the bracket 54 at the lower end so that they are freestanding upwardly from the bracket in a vertical array in a common plane along the sidewall with each heating element being spaced from the next and standing vertically parallel to the next.

The heating elements are located between an inwardly facing shield member 60 and an outwardly facing shield member 61. These shield members are supported in parallel spaced relation by a series of transverse posts 62. The space in between the shield members is arranged such that the heating element is spaced from both of the shield members and is generally equidistantly located between those two shield members. The height of the shield members is arranged such that the upper end of each of the shield members is above the upper end 56 of the heating element and the lower end of the shield members is below the lower end 58 of the heating element.

The shield members are formed of a suitable heat resistant material generally steel which can be stainless or galvanized steel. The shield members each formed by a single flat sheet of the shield material so that there is a channel defined between the shield members with an open top 63 of the channel and an open bottom 64 of the channel. This forms an air passage between the two shield members in that air can enter between the two shield members through the opening 64 of the lower end of the channel and can pass between the shield members to the upper open end 63 of the channel. The upper open end 63 is located below the baking zone at the top of the oven. The presence of the heating elements within the channel generates significant heat in this area which causes strong convection current within the channel acting to carry air from the opening 64 at the bottom through the opening 63 at the top so that air extends into the baking zone above the heating elements. The strong convection currents generated by this channel avoid the necessity for any form of fan or other air current assist system. The heating system is therefore a simple construction with no moving parts and yet carries the heated air to the top of the oven to the baking zone.

The inner shield member 60 covers the radiant heating section of the heating elements so that radiant heat directly from the heating elements is prevented from passing directly to the parts as they pass the heating elements on the carriage moving to or from the baking zone at the top of the oven.

The presence of the inner shield 60 is particularly important when the heated and baked parts are moved from the upper oven zone past the heating elements to the loading position 73 at the open bottom of the oven. It has been found that there is a tendency for the parts to be overheated as they pass the heating elements on the way down after the baking has been completed. Rather than turn off the heating elements as the parts pass, it is preferred to provide the shield which prevents the direct radiation impinging upon those parts.

The spacing between the shield members is arranged so that it allows air to pass between the shield members to generate an effective convection current of a significant volume of air to provide the heating at the oven zone at the top of the oven. The inner shield members 60 are spaced by a sufficient distance to allow the parts to pass between the shield members from the loading position to the baking position.

The channel defined between the shield members is a continuous channel along the length of the heating member spaced only by the sufficient numbers of the spacing posts 62 to hold the shield members properly vertical and parallel.

The outer shield member 62 inhibits the penetration of the heat from the heating elements to the panel 69. The shield member 62 thus acts to confine the heat between the two shield members for transportation by the air stream to the top of the housing.

The heating member defined by the heating elements and the shield members is mounted on the frame by a lower portion 82 of the outer shield member 61. Thus the lower portion 82 extends below the end of the inner shield member 60 and extends downwardly therefrom to the bottom member 19. At the bottom frame member 19 is provided a horizontal shielding plate 83 which is attached to the lower end portion 82 of the outer shield member 61. This shield plate 83 has an outer portion extending under the frame member 19 and an inner portion extending inwardly to a position beyond a plane parallel to the inner shield member 60 to an inner edge 84 at which is provided a downturned flange 85. The shield plate 83 thus provides a horizontal shield against downwardly radiated heat energy. A layer of insulation material 86 is applied on top of the plate 83 extends along the full length of the heating member so that it is co-extensive with the inner and outer shield members. This therefore provides generally an enclosure for the heating elements which is open only at the opening 64 between the lower end of the inner shield member and the plate 83. The shield plate 83 has a series of holes 87 at spaced positions along its length each for receiving a respective one of the heating elements 59. Thus each heating element extends from its respective bracket at the lower end through the hole 87 in the plate 83 into the channel between the inner and outer shield members. The layer 86 of the insulation material acts to inhibit heat from passing downwardly to a position below the shield plate 83 where it can act to heat the bracket 54. Attached to the underside of the shield plate 83 at each of the holes 87 is provided a sleeve 88 which is welded at 89 around the hole 87 and extends downwardly therefrom to a lower end 90. The lower end of the sleeve 88 is threaded as indicated at 91 to receive a threaded section of the bracket 54 so that a male thread of the bracket 54 screws into the female thread of the sleeve 88. A rectangular box 92 is attached to the lower end of the sleeves 88 by a flange 93 which is screwed up against the underside of the top plate 94 of the box so that the top plate 94 is held clamped against the bottom of the sleeve by the flange 94 and by the threaded bracket 54. The sleeve 88 has a series of holes around its periphery to allow the entry of air through each of the holes 95 to flow into the area above the bracket 54 and surrounding the lower end of the element 59 so that the air can pass upwardly through the holes 95 and outwardly through hole 87 to cause a flow of cooling air around the lower most end of the heating element 59.

The box 92 has depending side walls 96 and 98 attached to the edges of the top wall 94 together with a bottom wall 97 which can act as an opening to allow access to the interior of the box. The box 92 extends along the full length of the heating member and acts to contain the electrical wires and electrical connections to the brackets 54 of each of the heating elements.

Thus each heating element passes through its respective hole 87 in the plate 83 and then passes through its respective sleeve 88 to its bracket underneath the top wall 94 of the box 92.

The box 92 and the electrical connections contained therein are therefore maintained cool by the air flow through the sleeve 88 and by the shield plate 83 and its insulated covering layer 86.

Heat therefore from the heating element is confined so that it generally passes upwardly through the channel and little of the heat communicates downwardly to the electrical components within the box 92. This maintains electrical components at a cooled temperature sufficiently low to avoid damage to those electrical connections and to the bracket 54 itself.

Figure 5:
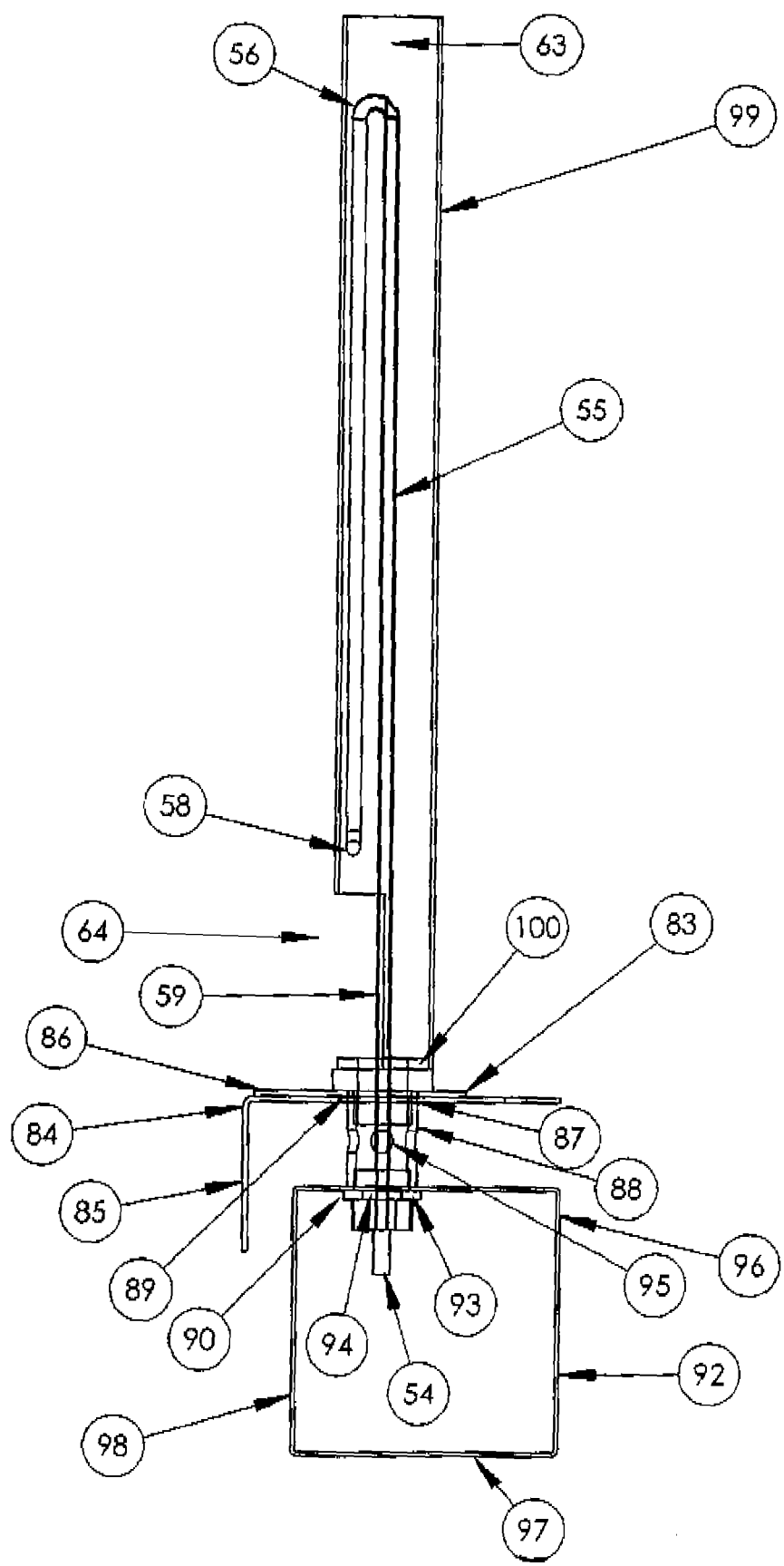
FIG. 5 is a cross sectional view of the heating assembly of FIG. 4.

Turning now to FIGS. 4 and 5 there is shown an alternate heating unit assembly. The difference with this unit is that each of the heating elements 55 is encased in a respective one of a plurality of stainless steel heat shield tubes 99. These tubes form a series of parallel ducts through which the air passes as previously described to flow to the top of the housing. Each tube has a cut out portion on the front face in the area below the heating section of the element to allow the air to enter that cut out. Each tube has its lower end welded to a heat shield tube holder 100. This holder is in turn threaded into the sleeve 88. The heat shield tube 99 is open at the top 63 to allow the hot air to rise and is cut open on half the tube at the lower end 64 to allow cool air to enter the tube. All other items are maintained as in the initial design.

The heating zone between the temperature sensors A and B is spaced downwardly from the top of the housing and below the discharge opening 78 which is itself spaced downwardly from the top wall. Thus when the discharge opening draws air out from the housing it does so above the heating zone leaving a layer or cushion or volume of heated air above the heating zone which can act as a heat buffer. The discharge opening is controlled by a venturi which acts to generate a forced flow in the discharge direction to a suitable discharge area to carry any contaminants away from the oven and the parts being baked. The venturi can be automatically controlled based on detection of escaping contaminants or on temperature changes at the oven heating zone.

The two thermocouples or temperature sensors are arranged to maintain the temperature at the sensor within a temperature of a predetermined range by activating selected ones of the heating elements 53. In FIG. 4 it will be noted that the temperature sensors provide a control signal to a control unit to the heating assemblies. In the embodiment shown the control unit drives two separate power supplies to separate ones of the heating elements in dependence on the temperature as detected by the respective sensors. Thus each heating assembly comprises an array of side by side heating elements and the heating elements are separated into said first and second parts at spaced alternate positions across the heating assembly. In particular the elements are separated into pairs so that the first two are connected to the first supply and the second two are connected to the second supply and so on across the width of the heating assembly. Thus as each temperature sensor drops below its set value, it acts to turn on one half of the heating assemblies in a spaced pattern across the width to add additional heat. This arrangement has been surprisingly found to maintain the whole heating zone within a predetermined temperature differing from the set value by no more than 5 degrees Celsius. This close control ensures that all of the parts of the batch see the same baking temperature with consistent baking of the parts.

Since various modifications can be made in my invention as herein above described, and many apparently widely different embodiments of same made within the spirit and scope of the claims without department from such spirit and scope, it is intended that all matter contained in the accompanying specification shall be interpreted as illustrative only and not in a limiting sense.

The invention claimed is:

1. An apparatus for baking one or more parts in a batch comprising:
   a housing having side walls and a top wall defining a substantially closed container with a substantially closed top end and an opening at a bottom end;
   at least one heating assembly within the housing at a position therein below the top end for generating heat in the housing such that heat rises in the housing from the heating assembly and causes the top end above the heating assembly to reach an oven temperature for baking the parts;
   a carrying arrangement in the housing for carrying the batch of parts;
   a lifting and guide arrangement for guiding movement of the carrying arrangement upwardly in an upward path from a first position at the bottom end of the housing to a second position at the top end and in a downward path back to the first position;
   the housing, the lifting and guide arrangement and the carrying arrangement being arranged such that, in the first position, the carrying arrangement is exposed at the bottom end for loading the batch for baking and for unloading of the batch when baked;
   and a control system for controlling said at least one heating assembly and the lifting and guide arrangement such that, in the second position, the carrying arrangement is held stationary for a period of time for baking of the batch;
   said at least one heating assembly comprising a generally planar heating array arranged along one side wall inwardly of the side wall and such that the carrying arrangement passes said at least one heating assembly as it moves from the first position to the second position;
   a shield arrangement located in front of the heating array relative to the carrying arrangement so as to block at least part of the heat from the heating array from directly radiating onto the batch of parts on the carrying arrangement as the carrying arrangement passes the heating array.

2. The apparatus according to claim 1 wherein the shield arrangement is shaped and arranged relative to the side wall so as to define at least one inlet opening below the shield arrangement for entry of air behind the shield arrangement and an outlet opening above the shield arrangement for exit of air from behind the shield arrangement such that the heat from said at least one heating assembly generates a flow of air upwardly behind the shield arrangement to carry the heat in the airflow to the top of the housing.

3. The apparatus according to claim 1 wherein the shield arrangement is shaped and arranged to block sufficient of the heating array to prevent overheating of the batch as the carrying arrangement is lowered to the first position.

4. The apparatus according to claim 1 wherein there are two heating assemblies each comprising a generally planar heating array arranged along a respective side wall inwardly of the side wall with the heating arrays opposed to face one another and such that the carrying arrangement passes between said heating assemblies as it moves from the first position to the second position and wherein there are two shield arrangements each located in front of a respective the heating array relative to the carrying arrangement so as to block at least part of the heat from the heating array from directly radiating onto the batch of parts on the carrying arrangement as the carrying arrangement passes the heating array.

5. The apparatus according to claim 1 wherein the shield arrangement comprises a shield plate located in front of the heating assembly.

6. The apparatus according to claim 5 wherein the shield plate is planar and generally parallel to the heating assembly.

7. The apparatus according to claim 1 wherein the heating assembly comprises an array of side by side heating elements.

8. The apparatus according to claim 1 wherein the shield arrangement comprises a series of separate shield portions each associated with a respective one of the heating elements.

9. The apparatus according to claim 1 wherein the shield arrangement comprises a series of tubes each surrounding a respective one of the heating elements.

10. The apparatus according to claim 1 wherein the heating array comprises a plurality of upstanding heating elements each having a bottom electrical connection, an upstanding non-heating connection portion and an upper heating section.

11. The apparatus according to claim 10 wherein the shield arrangement is shaped and arranged to block substantially all of the heating sections of the heating elements.

12. The apparatus according to claim 11 wherein the shield arrangement blocks sufficient of the heating sections of the heating elements to prevent overheating of the batch as the carrying arrangement is lowered to the first position.

13. The apparatus according to claim 1 wherein the heating array comprises a plurality of upstanding heating elements each having a bottom electrical connection, an upstanding connection portion and an upper heating section, wherein there is provided an electrical connection box having an upper wall with the electrical connection of each of the elements mounted in the upper wall and the connection portion and the heating section stand upwardly from the upper wall and electrical connector wires of the elements are located in the box, wherein there is provided an insulated heat shield plate above the upper wall and generally parallel thereto with each of the elements projecting through a respective hole in the heat shield plate so that the upper heating section is above the heat shield plate.

14. The apparatus according to claim 13 wherein there is provided a collar surrounding the connection portion between the upper wall and the heat shield plate, the collar having openings therein to allow entry of air into the collar and escape of air from a top of the collar through the heat shield plate.

15. The apparatus according to claim 14 wherein the top of the collar is coextensive with the respective hole in the heat shield plate.

16. The apparatus according to claim 1 wherein a ventilation outlet is arranged at the top of the housing.

17. The apparatus according to claim 1 wherein the housing has reflective inner walls to reflect infrared rays emitted by the heating assembly.

18. An apparatus for baking a batch of parts comprising:
a housing having side walls and a top wall defining a substantially closed container with a substantially closed top end and an open downwardly facing bottom end;
at least one heating assembly within the housing at a position therein below the top end for generating heat in the housing such that heat rises in the housing from the heating assembly and causes the top end above the heating assembly to reach an oven temperature for baking the parts;
a carrying arrangement in the housing for carrying the batch of parts;
a lifting and guide arrangement for guiding movement of the carrying arrangement upwardly in an upward path from a first position at the bottom end of the housing to a second position at the top end and in a downward path back to the first position;
the housing, the lifting and guide arrangement and the carrying arrangement being arranged such that, in the first position, the carrying arrangement is exposed at the bottom end for loading the batch of parts for baking and for unloading of the batch of parts when baked;
and a control system for controlling said at least one heating assembly and the lifting and guide arrangement such that, in the second position, the carrying arrangement is held stationary for a period of time for baking of the parts;
said at least one heating assembly being arranged along one side wall inwardly of the side wall and such that the carrying arrangement passes said at least one heating assembly as it moves from the first position to the second position;
wherein the heating assembly comprises a plurality of upstanding heating elements each having a bottom electrical connection, an upstanding connection portion and an upper heating section;
wherein there is provided an electrical connection box having an upper wall with the electrical connection of each of the elements mounted in the upper wall such that the connection portion and the heating section stand upwardly from the upper wall and electrical connector wires of the elements are located in the box;
and wherein there is provided an insulated heat shield plate above the upper wall and generally parallel thereto with each of the elements projecting through a respective hole in the heat shield plate so that the upper heating section is above the heat shield plate.

19. The apparatus according to claim 18 wherein there is provided a collar surrounding the connection portion between the upper wall and the heat shield plate, the collar having openings therein to allow entry of air into the collar and the collar having an open top to allow escape of air from a top of the collar and through the heat shield plate.

20. The apparatus according to claim 19 wherein the top of the collar is coextensive with the respective hole in the heat shield plate.

21. An apparatus for baking one or more parts in a batch comprising:
a housing having side walls and a top wall defining a substantially closed container with a substantially closed top end and an opening at a bottom end;
at least one heating assembly within the housing at a position therein below the top end for generating heat in the housing such that heat rises in the housing from the heating assembly and causes the top end above the heating assembly to reach an oven temperature for baking the parts;

a carrying arrangement in the housing for carrying the batch of parts;

a lifting and guide arrangement for guiding movement of the carrying arrangement upwardly in an upward path from a first position at the bottom end of the housing to a second position at the top end and in a downward path back to the first position;

the housing, the lifting and guide arrangement and the carrying arrangement being arranged such that, in the first position, the carrying arrangement is exposed at the bottom end for loading the batch for baking and for unloading of the batch when baked;

and a control system for controlling said at least one heating assembly and the lifting and guide arrangement such that, in the second position, the carrying arrangement is held stationary for a period of time for baking of the batch;

said at least one heating assembly arranged along one side wall inwardly of the side wall and such that the carrying arrangement passes said at least one heating assembly as it moves from the first position to the second position;

wherein the heating assembly is located in at least one duct within the housing with an inlet opening at a bottom of the heating assembly and a discharge opening at a top of the heating array so as to generate a flow of air upwardly within said at least one duct to carry the heat in the airflow to the top of the housing.

22. The apparatus according to claim 21 wherein the heating assembly comprises a plurality of side by side elements and wherein each of the elements is located in a respective one of a plurality of ducts.

23. The apparatus according to claim 21 wherein the heating assembly comprises a plurality of side by side elements and wherein said at least one duct includes a shield plate located in front of a plurality of the heating elements.

24. An apparatus for baking one or more parts in a batch comprising:

a housing having side walls and a top wall defining a substantially closed container with a substantially closed top end and an opening at a bottom end;

at least one heating assembly within the housing at a position therein below the top end for generating heat in the housing such that heat rises in the housing from the heating assembly and causes the top end above the heating assembly to reach an oven temperature for baking the parts;

a carrying arrangement in the housing for carrying the batch of parts;

a lifting and guide arrangement for guiding movement of the carrying arrangement upwardly in an upward path from a first position at the bottom end of the housing to a second position at the top end and in a downward path back to the first position;

the housing, the lifting and guide arrangement and the carrying arrangement being arranged such that, in the first position, the carrying arrangement is exposed at the bottom end for loading the batch for baking and for unloading of the batch when baked;

a control system for controlling said at least one heating assembly and the lifting and guide arrangement such that, in the second position, the carrying arrangement is held stationary for a period of time for baking of the batch;

said at least one heating assembly arranged along one side wall inwardly of the side wall and such that the carrying arrangement passes said at least one heating assembly as it moves from the first position to the second position;

the second position at the top end of the housing defining a heating zone located above said at least one heating assembly and located below the top wall;

a first temperature sensor at the bottom of the heating zone above said at least one heating assembly;

and a second temperature sensor at the top of the heating zone;

the control system being arranged to maintain the heating zone within a predetermined range of temperatures by controlling a first part of said at least one heating assembly in response to changes in temperature at said first sensor and by controlling a second part of said at least one heating assembly in response to changes in temperature at said second sensor.

25. The apparatus according to claim 24 wherein the at least one heating assembly comprises an array of side by side heating elements and wherein the heating elements are separated into said first and second parts at spaced alternate positions across the heating assembly.

26. The apparatus according to claim 24 wherein there is provided a vent opening at a position at the top of the heating zone spaced downwardly from the top wall so as to form a volume of heated air between the heating zone and the top wall.

27. The apparatus according to claim 24 wherein the vent opening includes a component for creating a forced flow through the vent opening from the interior of the housing.

* * * * *